(12) United States Patent
Ouyang et al.

(10) Patent No.: US 7,880,522 B2
(45) Date of Patent: Feb. 1, 2011

(54) DOUBLE-EDGE PWM CONTROLLER AND ITS CONTROL METHOD THEREOF

(75) Inventors: Qian Ouyang, Hangzhou (CN); Xiaoli Kong, Hangzhou (CN); Yuancheng Ren, Hangzhou (CN); Eric Yang, Saratoga, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 58 days.

(21) Appl. No.: 12/476,526

(22) Filed: Jun. 2, 2009

(65) Prior Publication Data

US 2009/0295445 A1    Dec. 3, 2009

(30) Foreign Application Priority Data

Jun. 3, 2008    (CN) .................... 2008 1 0100039

(51) Int. Cl.
*H03K 7/08*    (2006.01)
(52) U.S. Cl. ..................................... 327/172

(58) Field of Classification Search ......... 327/172–174, 327/176
See application file for complete search history.

(56) References Cited

U.S. PATENT DOCUMENTS

| 4,603,425 | A | * | 7/1986 | Berlinsky et al. | ........... 375/238 |
| 4,634,892 | A | * | 1/1987 | Isbell et al. | .................. 327/176 |

* cited by examiner

*Primary Examiner*—Lincoln Donovan
*Assistant Examiner*—William Hernandez
(74) *Attorney, Agent, or Firm*—Perkins Coie LLP

(57) ABSTRACT

The present invention discloses a double-edge pulse width modulation (PWM) controller based on the output current and output voltage which is modulated in real time by the output current and the output voltage. The controller uses an extra first adder to sum up the compensation signal and a triangular signal (or a saw-tooth signal); a second adder to sum up the output current signal to a bias value; a PWM comparator, with its non-inverting input receiving the output of said first adder, its inverting input receiving the output of said second adder and outputs the PWM signal.

10 Claims, 10 Drawing Sheets

US 7,880,522 B2

DOUBLE-EDGE PWM CONTROLLER AND ITS CONTROL METHOD THEREOF

CROSS-REFERENCE TO RELATED APPLICATIONS

This application claims the benefit of Chinese Patent Application No. 200810100039.5, filed on Jun. 3, 2008, which is hereby incorporated by reference in its entirety.

TECHNICAL FIELD

The present invention relates to DC-DC converters, and more particularly, relates to double-edge pulse width modulation (PWM) control in a DC-DC converter.

BACKGROUND

Modern electronic devices have high requirements with respect to transient response from a power supply. For example, microprocessors typically require that the power should respond nearly instantly to load variation. Multiple prior art methods have been developed in the controller of the DC-DC converter to achieve stable powering during transient load variation.

Pulse width modulation (PWM) is a basic control approach in DC-DC converters. FIG. 1 shows a trailing-edge PWM control waveform for peak current mode control. The peak current mode control has advantages over voltage mode control, including good linear modulation, simple network compensation and so on. As seen in FIG. 1, the upper waveform is a compensated saw-tooth signal Vsaw+Vc which is the sum of the compensation signal and the saw-tooth signal. At the leading edge of the compensated saw-tooth signal, the PWM signal is set HIGH. When the current signal reaches the compensated saw-tooth signal, the PWM signal is set LOW wherein the current signal is a feedback of the output current. In this control method, the PWM is set HIGH only at the leading edge and cannot respond quickly to the load variation. In other words, between the time of when PWM is set LOW and the time of the leading edge appearing, if load variation occurs, the PWM signal cannot respond until the next leading edge.

If a load transient variation occurs at the time that PWM is set low, the response delay is (1−D)*T, where D is the duty cycle, and T is the time of a cycle. When D is small, the delay can be close to one cycle. Thus, a new PWM control approach is required which has the benefits of current mode control, and also quick transient response.

BRIEF DESCRIPTION OF THE DRAWINGS

The accompanying drawings, which are incorporated in and from a part of this specification, illustrate embodiments of the invention and, together with the description serve to explain the principles of the invention.

FIG. 4A shows the result of the perturbation susceptibility with the control, FIG. 4B shows the transient response during load step down and FIG. 4C shows the transient response during load step up.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
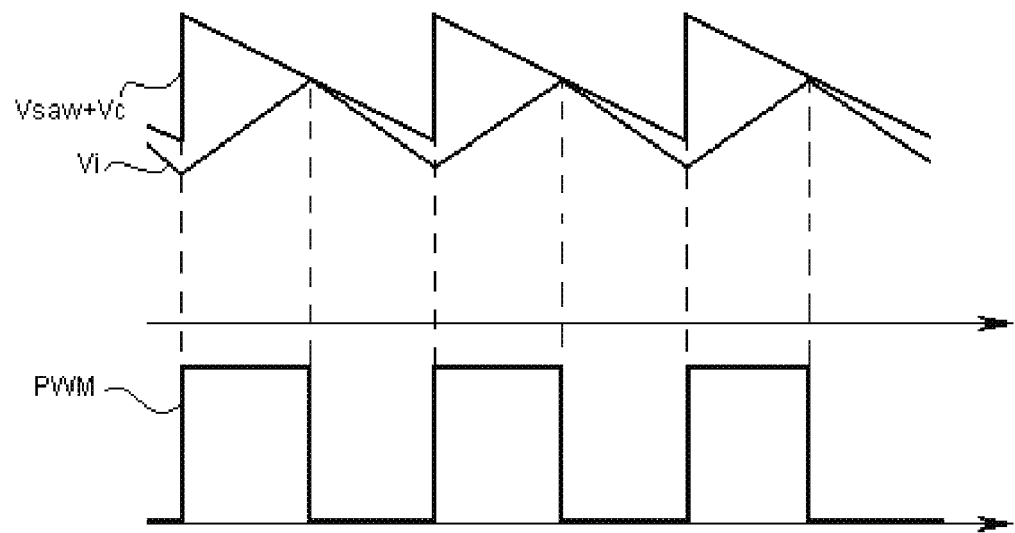
FIG. 1 illustrates the peak current mode PWM control as a prior art.
Figure 2:
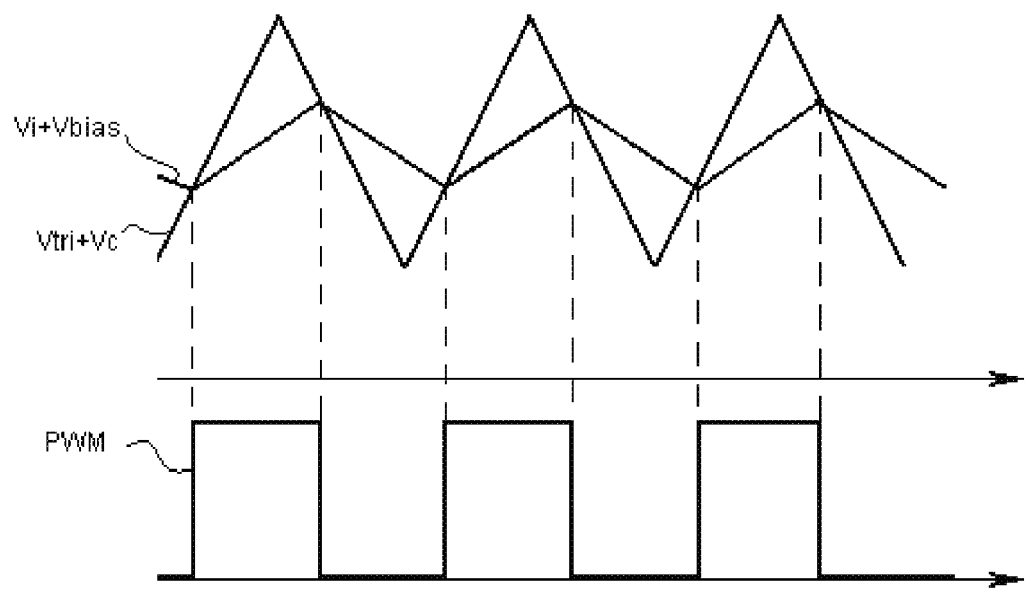
FIG. 2 illustrates the double-edge PWM control according to one embodiment of the present invention.

FIG. 2 shows the waveforms of a double-edge PWM control method in accordance with one embodiment of the present invention. The waveform Vi+Vbias represents a current signal which is the sum of the output current feedback voltage Vi and a biased value Vbias, where Vi is the sampled voltage signal of the output current of the converter and is proportional to the output current. Vbias is a predetermined DC voltage value. The current signal Vi+Vbias has a lower slope compared to the waveform Vtri+Vc. Vtri+Vc represents a compensated triangular signal which is the sum of the compensation signal Vc and a triangular signal Vtri. In the control, the slope of Vtri (Svtri) should be higher than the slope of Vi (Svi) to ensure reliable triggering. The slope of Vi is: $Svi = (Vin\_max - Vout\_min) * Gcs / L$, where Vin_max is the maximum input voltage, Vout_min is the minimum output voltage, Gcs is the gain of output current sampling and L is the output inductor of the buck converter.

Thus, L should satisfy the equation of $L > (Vin\_max - Vout\_min) * Gcs / Svtri$ in the control. Vbias is used to pull up Vi to intersect with Vtri+Vc at proper level to generate the accurate duty cycle. When Vtri+Vc>Vi+Vbias, PWM is set HIGH. When Vtri+Vc<Vi+Vbias, PWM is set LOW as shown in FIG. 2. This control approach triggers PWM at both edges and is modulated in real time by both the output current and the output voltage which improves transient response. This double-edge PWM control adopts current mode control which thus provides the advantages on linear modulation and simple network compensation.

Figure 3:
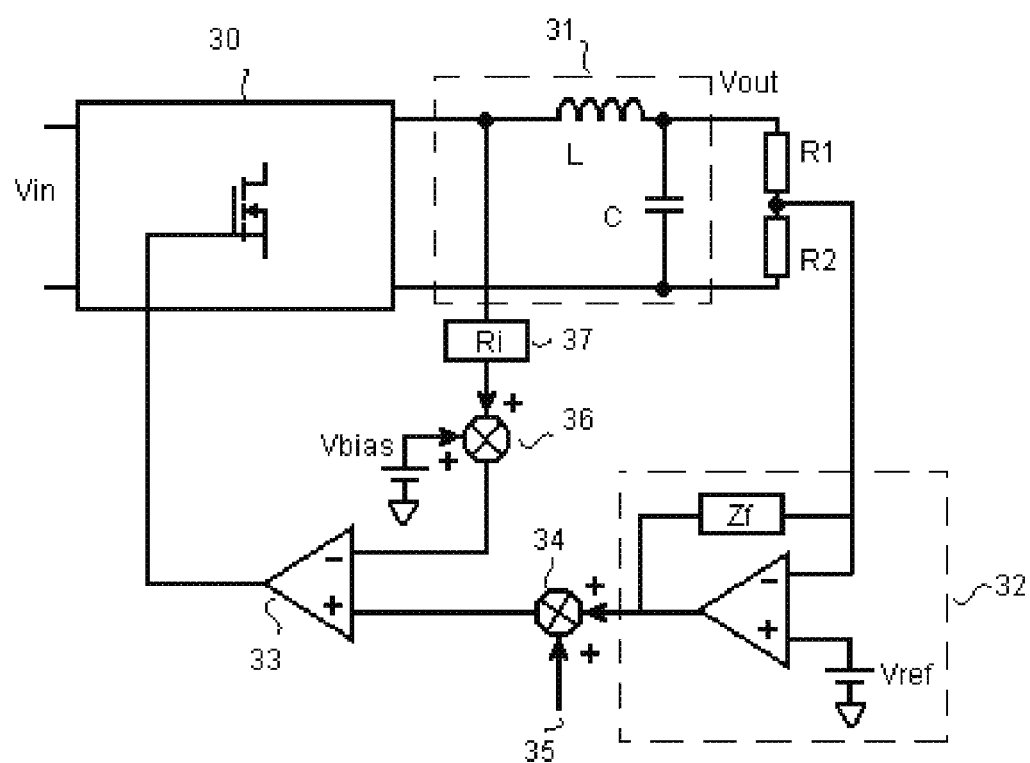
FIG. 3 shows a circuit diagram of a DC-DC converter system according to one embodiment of the present invention.

FIG. 3 shows a circuit diagram of a DC-DC converter according to one embodiment of the present invention. The circuit comprises a switch element 30, a filtering element 31 comprising the output inductor L and the output capacitor C, an output voltage feedback element comprising the resistor R1 and R2, an output current feedback element 37, an error amplifier 32 with compensation network Zf, a first adder 34, a second adder 36, and a PWM comparator 33. The double-edge PWM controller comprises the error amplifier 32, the first adder 34, the second adder 36, and the PWM comparator 33.

In another embodiment, the double-edge PWM controller further comprises the output voltage feedback element and the output current feedback element. The double-edge PWM controller can further include other element(s). The output voltage feedback element senses the output voltage and outputs an output voltage feedback signal Vo proportional to Vout. Vo is input to the inverting input of the error amplifier 32. The non-inverting input of the error amplifier 32 receives a reference voltage Vref. The error amplifier 32 with compensation network Zf outputs the compensation signal Vc. The first adder 34 sums up the compensation signal Vc and a signal 35. The signal 35 can be either triangular signal or saw-tooth signal with frequency fs equal to the switching frequency of the switch element 30. The output current feedback element 37 senses the output current and outputs the output current feedback voltage Vi. In one embodiment, the output current is the current flowing through the output inductor. The second adder 36 adds up the output current feedback voltage Vi and a DC biased voltage Vbias. The output of the first adder 34 is connected to the non-inverting input of the PWM comparator 33 and the output of the second adder 36 is connected to the inverting input of the PWM comparator 33. When the output of the first adder 34 is higher than that of the second adder 36, the PWM comparator 33 outputs a HIGH PWM signal. In contrast, when the output of the first adder 34 is lower than that of the second adder 36, the PWM comparator 33 outputs a LOW PWM signal.

In one embodiment, signal 35 is symmetrical triangular signal and the converter and the double-edge PWM controller described above are used to take out the control that is illustrated in the control waveforms of FIG. 2. In another embodiment, signal 35 is an asymmetrical triangular signal. In yet another embodiment, signal 35 is a saw-tooth signal.

Figure 4A:
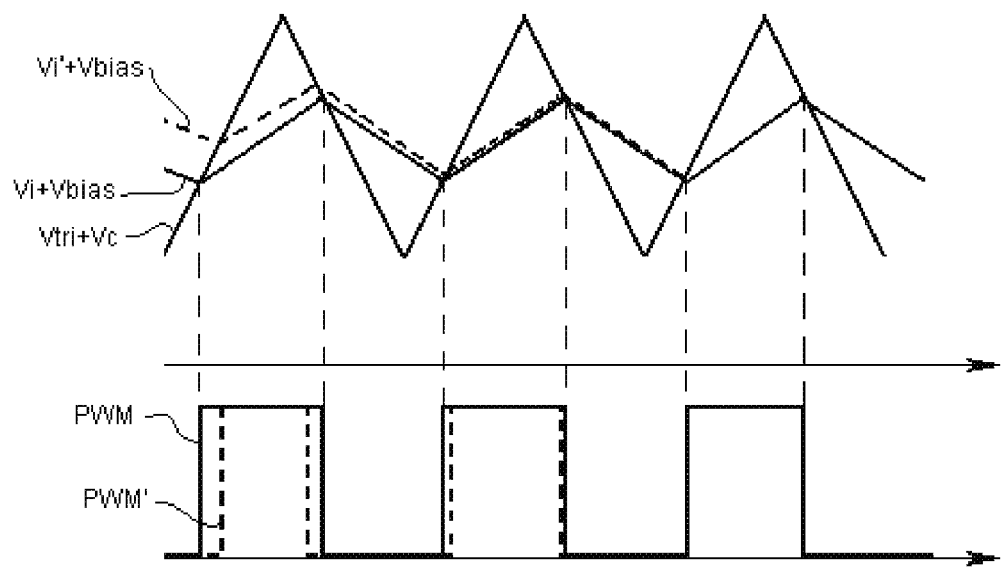
FIGS. 4A, 4B and 4C show the control results of the double-edge PWM control as illustrated in FIG. 2, where
Figure 4A:
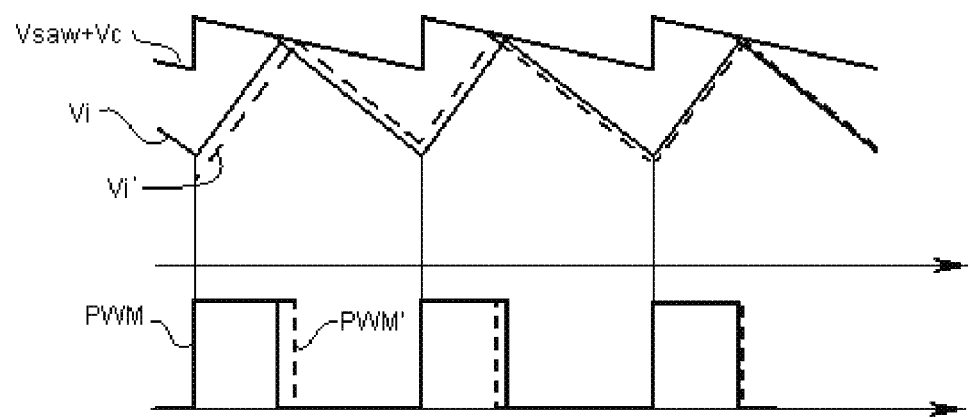

FIG. 4A illustrates the perturbation susceptibility result of double-edge PWM control with a symmetrical triangular signal at the upper side and the perturbation susceptibility result of peak current mode PWM control at the bottom side as a comparison. As seen in the upper side diagram, the dotted line represents the current signal under perturbation Vi'+Vbias with a higher output current. Under the perturbation, the duty cycle is decreased from PWM to PWM' to achieve the automatic adjustment. Compared to the peak current mode control at the bottom side, the double-edge PWM control with symmetrical triangular signal achieves convergence faster. Moreover, the duty cycles of PWM' in peak current mode control vibrates alternately. This does not happen in double-edge PWM control.

Figure 4B:
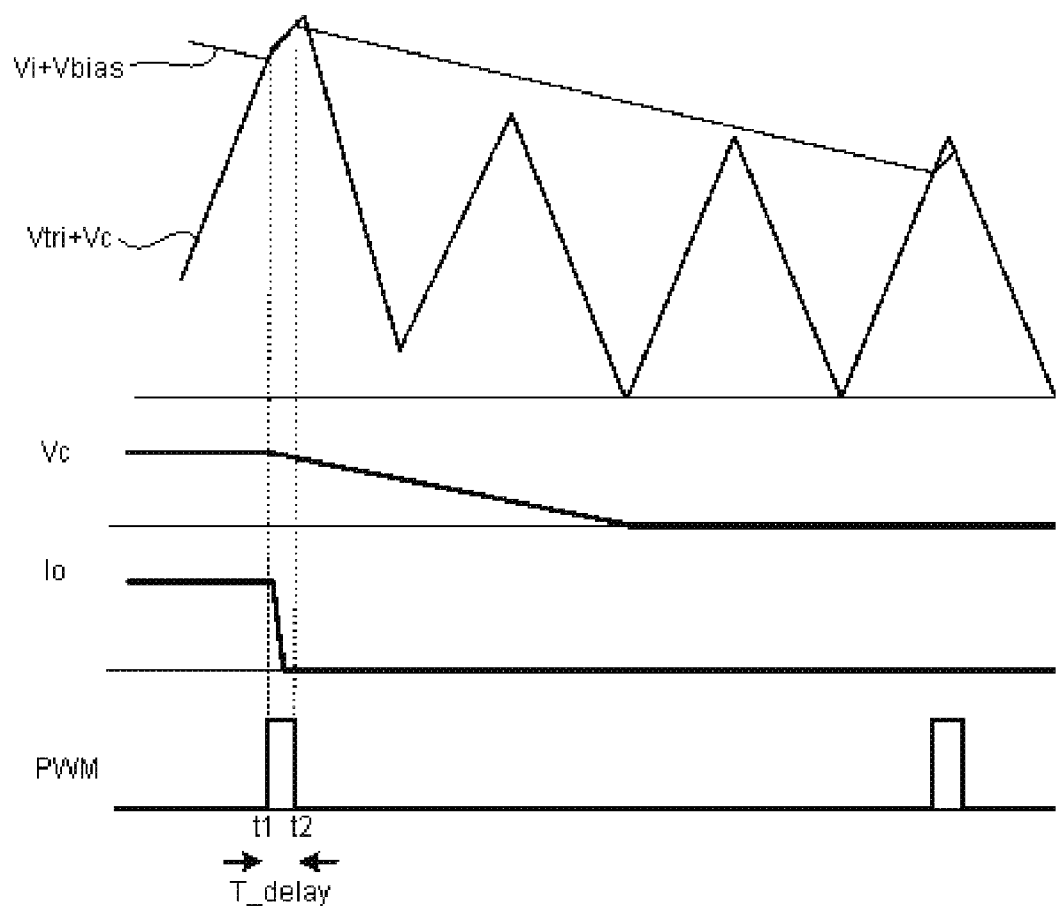

FIG. 4B shows the transient response during load step down with the double-edge PWM control as illustrated in FIG. 2. At time t1, the output current Io steps down, and the compensation signal Vc and the compensated triangular signal Vtri+Vc decrease accordingly. Decrease of Vtri+Vc accelerates the trailing edge triggering of the PWM signal as seen. At time t2, PWM is set LOW, thus the response delay is: T_delay=t2−t1. In the following two cycles, Vtri+Vc keeps lower than Vi+Vbias, and PWM keeps LOW for two cycles which leads to decrease of the effective duty cycle and responses effectively to the load step down.

Figure 4C:
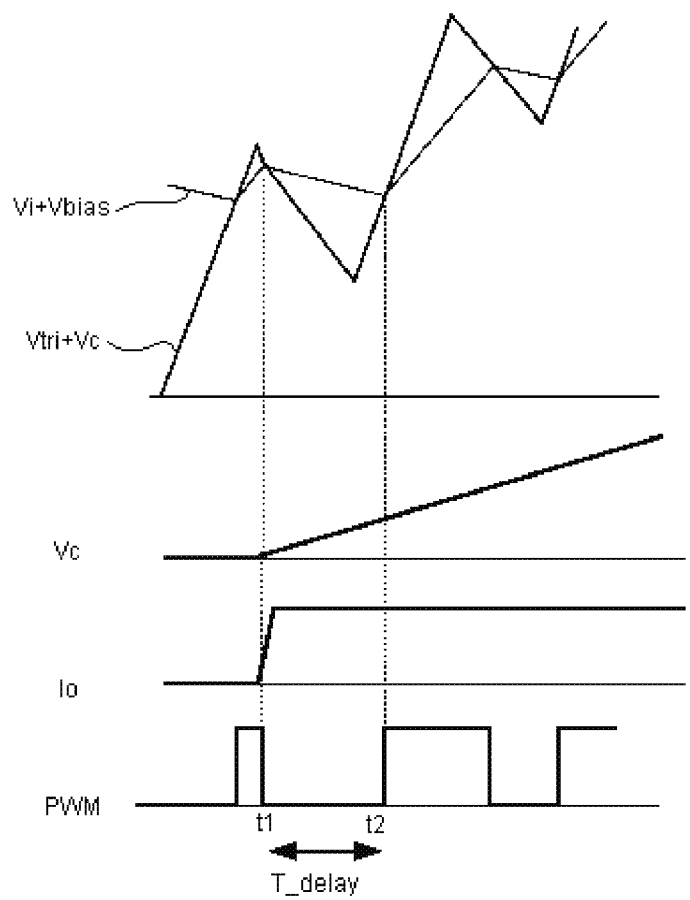

FIG. 4C shows the transient response during load step up. Supposing a worst case situation, at time t1, PWM is changed from HIGH to LOW, and meanwhile, the load steps up. This leads to the increase of Vc which accelerates the coming of the leading edge of the PWM signal (Vtri+Vc>Vi+Vbias). At time t2, PWM is set HIGH. It can be concluded from the figure that the maximum response delay is about: T_delay=0.5T. This is much smaller than the maximum delay of about T with the prior art peak current mode control.

From FIG. 4B and FIG. 4C, it can be seen that the response during load step down is faster than that during load step up. That is because, during load step down, the slope of Vtri+Vc is close to that of Vi+Vbias, and Vtri+Vc<Vi+Vbias comes quickly. And during load step up, the slope difference between Vtri+Vc and Vi+Vbias is larger than that during normal load, and it takes more time to achieve Vtri+Vc>Vi+Vbias.

Figure 5A:
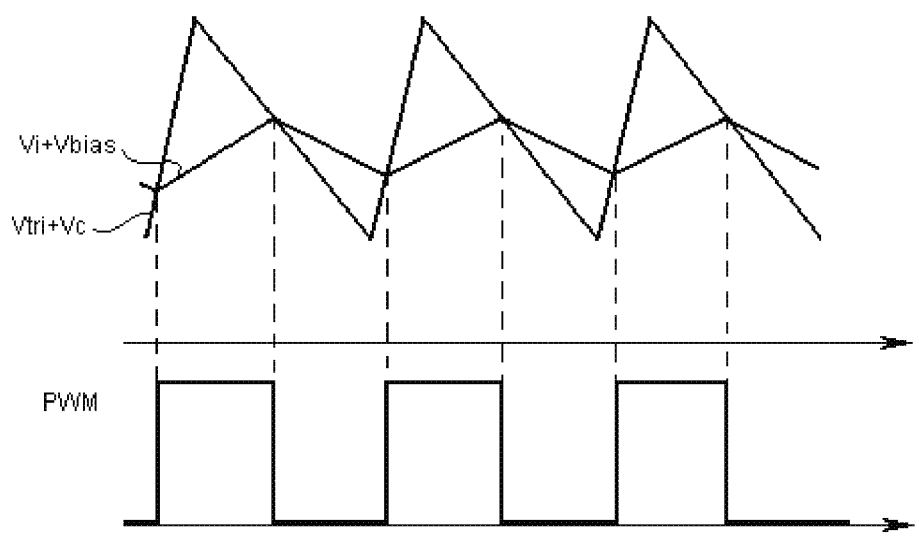
FIG. 5A shows a double-edge PWM control waveform where an asymmetrical triangular signal is adopted in the circuit shown in FIG. 3 as one embodiment of the present invention.
Figure 5B:
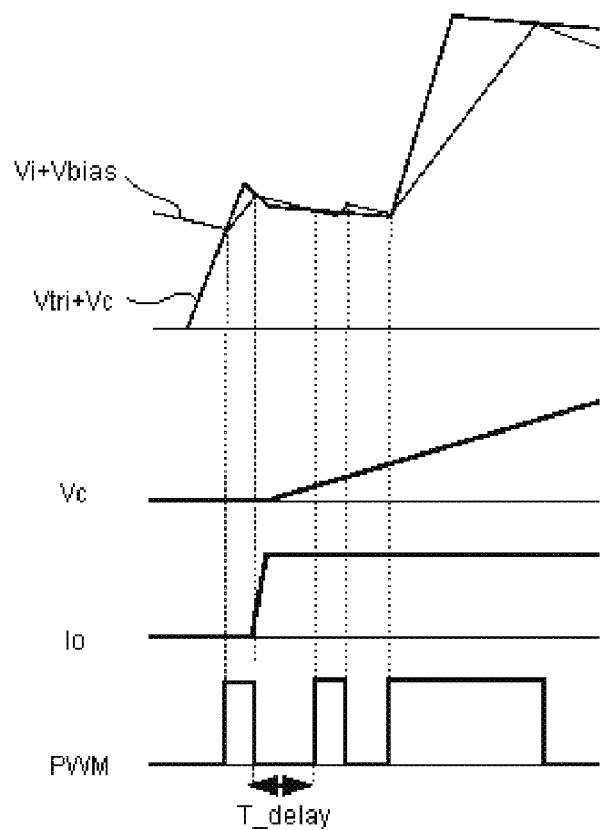
FIG. 5B shows its transient response during load step up.

FIG. 5A illustrates double-edge PWM control waveforms with an asymmetrical triangular signal in accordance to one embodiment of the present invention. The control is taken out in one embodiment with the circuit illustrated in FIG. 3. In this control method, PWM is triggered HIGH when Vtri+Vc>Vi+Vbias and is triggered LOW when Vtri+Vc<Vi+Vbias. Compared to the double-edge PWM control with a symmetrical triangular signal, this asymmetrical triangular signal has a higher slope at the rising edge than that at the descending edge thus the leading edge of PWM comes sooner which leads to a better response during load step up. It can be seen in FIG. 5B that it response fast during load step up and the delay time T_delay decreases compared to the double-edge PWM control with a symmetrical triangular signal as shown in FIG. 4C. In contrast, if the asymmetrical triangular adopted in the double-edge PWM control has a lower slope at the rising edge than that at the descending edge, it has a faster response during load step down than that with a symmetrical triangular signal.

Figure 6:
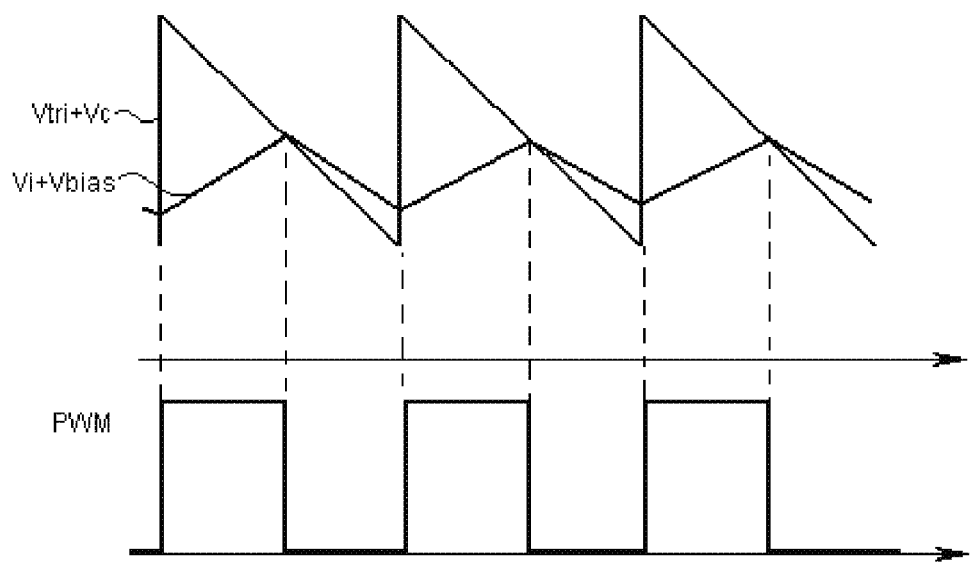
FIG. 6 illustrates the double-edge PWM control waveforms where saw-tooth signal is adopted in the circuit shown in FIG. 3 as one embodiment of the present invention.

FIG. 6 illustrates the double-edge PWM control with saw-tooth signal as one embodiment of the present invention. The control is taken out in one embodiment with the circuit illustrated in FIG. 3. In this control method, PWM is triggered HIGH when Vtri+Vc>Vi+Vbias and is triggered LOW when Vtri+Vc<Vi+Vbias. Compared to the embodiment shown in FIG. 5A, the double-edge PWM control with saw-tooth signal as shown has even better response during load step up. However, adopting the saw-tooth signal as shown in FIG. 6 leads to worse response during load step down.

Figure 7A:
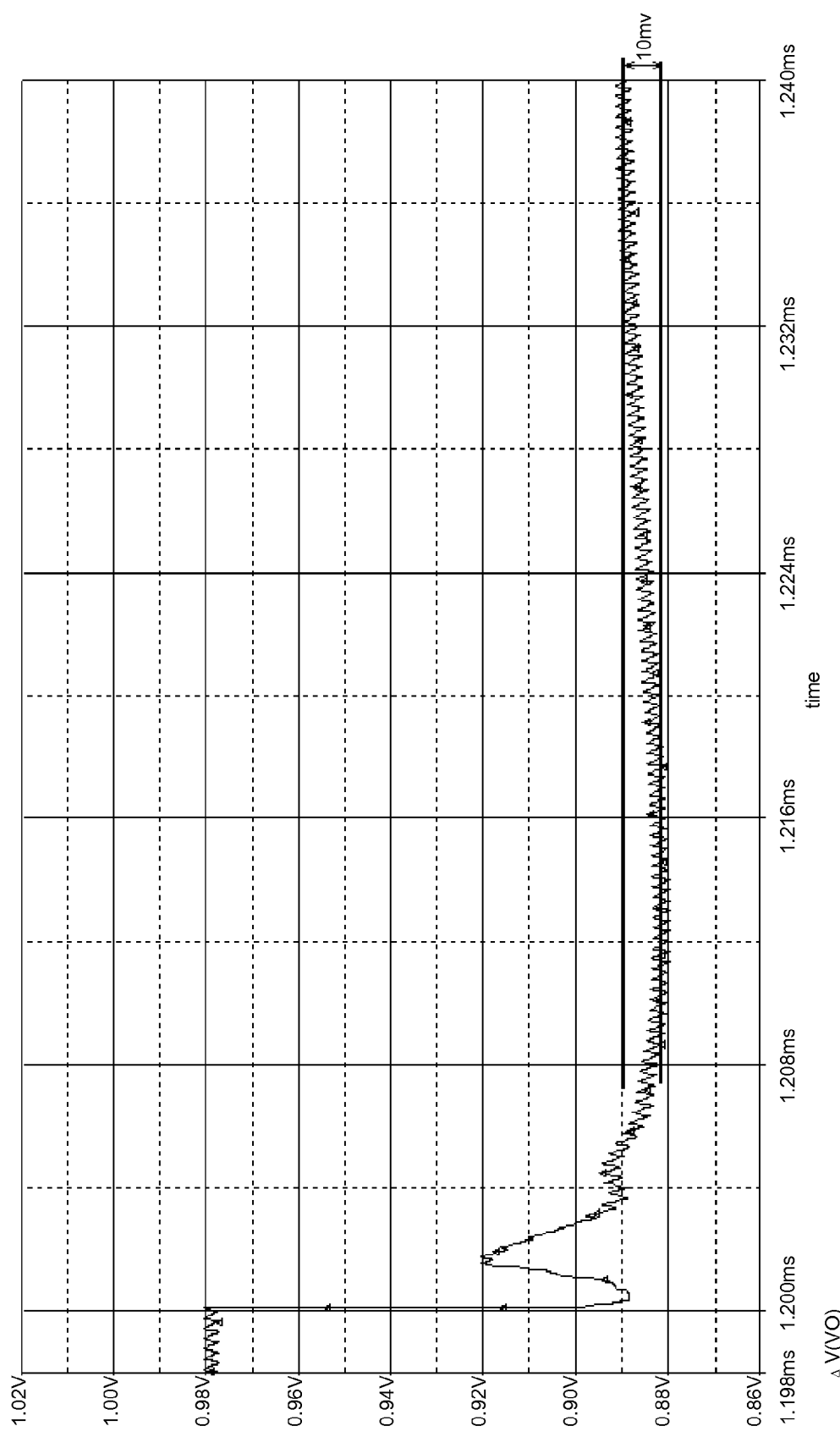
FIG. 7A shows the simulation result of the output voltage under the peak current mode control.
Figure 7B:
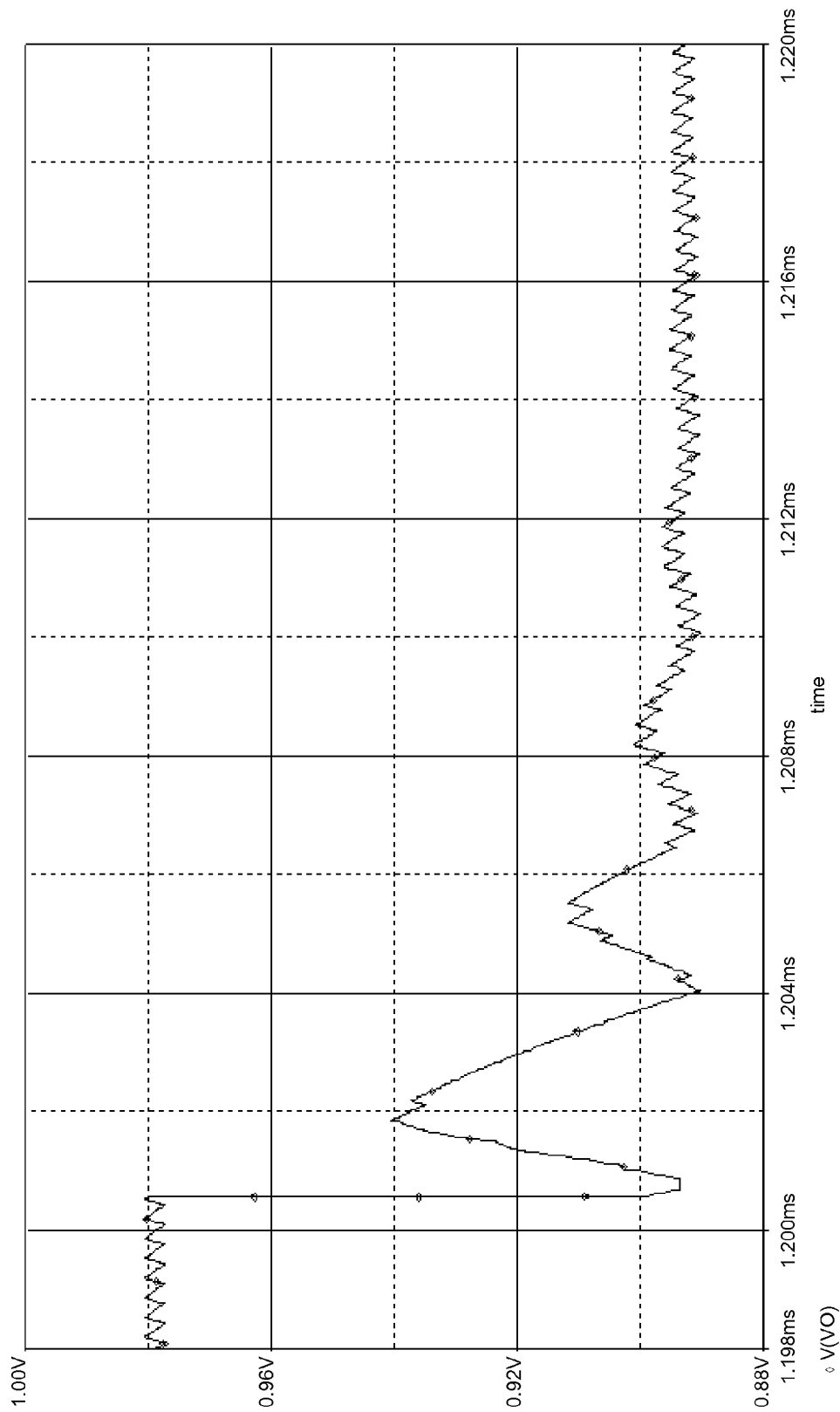
FIG. 7B shows the simulation result of the output voltage under the double-edge PWM control as illustrated in FIG. 2.

With peak current mode control, when the load changes abruptly, the output voltage will deviate before it becomes stable. The simulation diagram in FIG. 7A shows this deviation. In this simulation, the parameters are set as: L=0.47 uH, C=990 uF, Cesr=2 mΩ and fs=1 MHz, where L is the output inductor, C is the output capacitor, Cesr is the ESR capacitor and fs is the frequency of the switching frequency. When the load increases from 10 A to 50 A with change rate of 5 A/ns, an output voltage deviation of about 10 mV appears with the peak current mode control. While in the double-edge PWM control as described in FIG. 2, there is no output voltage deviation as shown in FIG. 7B with the same parameters.

Figure 8A:
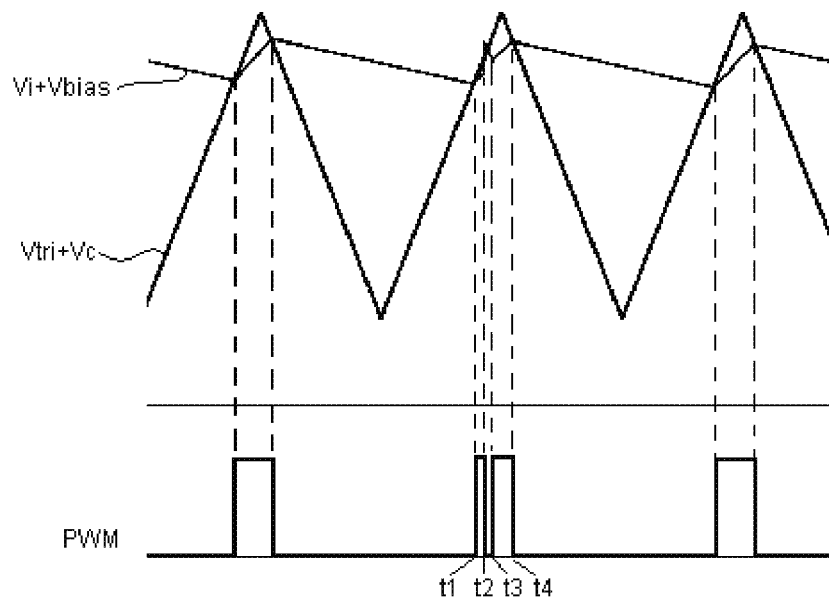
FIG. 8A illustrates the noise sensitivity of the double-edge PWM control as illustrated in FIG. 2.
Figure 8B:
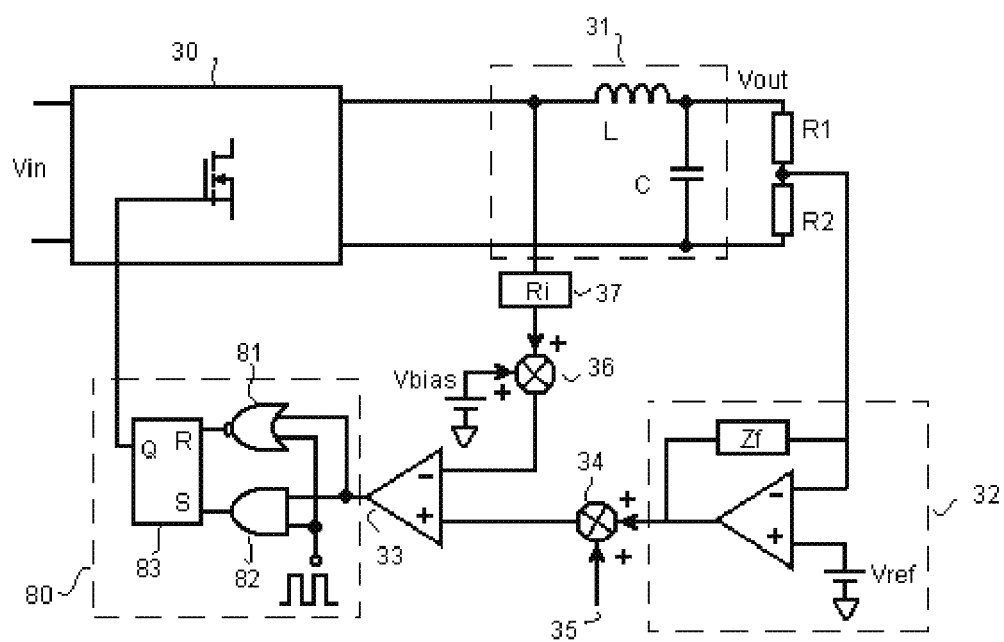
FIG. 8B illustrates a combined noise suppression circuit.

While it has fast response for the double-edge PWM control compared to the peak current mode control, the double-edge PWM control has a drawback on the noise sensitivity. FIG. 8A shows the noise sensitivity of the double-edge PWM control. At time t1, Vtri+Vc>Vi+Vbias, the PWM signal is set HIGH. Shortly after t1, at time t2, noise appears with a small spine which may cause Vtri+Vc<Vi+Vbias and set the PWM signal LOW by error. PWM is set HIGH again when the noise disappears. Wrong PWM signal appears during t2 and t3. In order to eliminate the noise impact, a noise suppression circuit 80 is added in one embodiment to the double-edge PWM controller to improve the reliability of the double-edge PWM control as shown in FIG. 8B. The noise suppression circuit 80 comprises an AND gate 82, a NOR gate 81 and an RS flip-flop 83. One input of the AND gate 82 is connected to the output of the PWM comparator 33, the other input of the AND gate 82 receives a clock signal and the output of the AND gate 82 is connected to the SET (S) input of the RS flip-flop 83. The NOR gate 81 also receives the output signal of the PWM comparator 33 and the clock signal and has its output connected to the RESET (R) input of the RS flip-flop 83. Further, the RS flip-flop 83 puts out a modulated PWM signal which is immune to the noise.

Figure 8C:
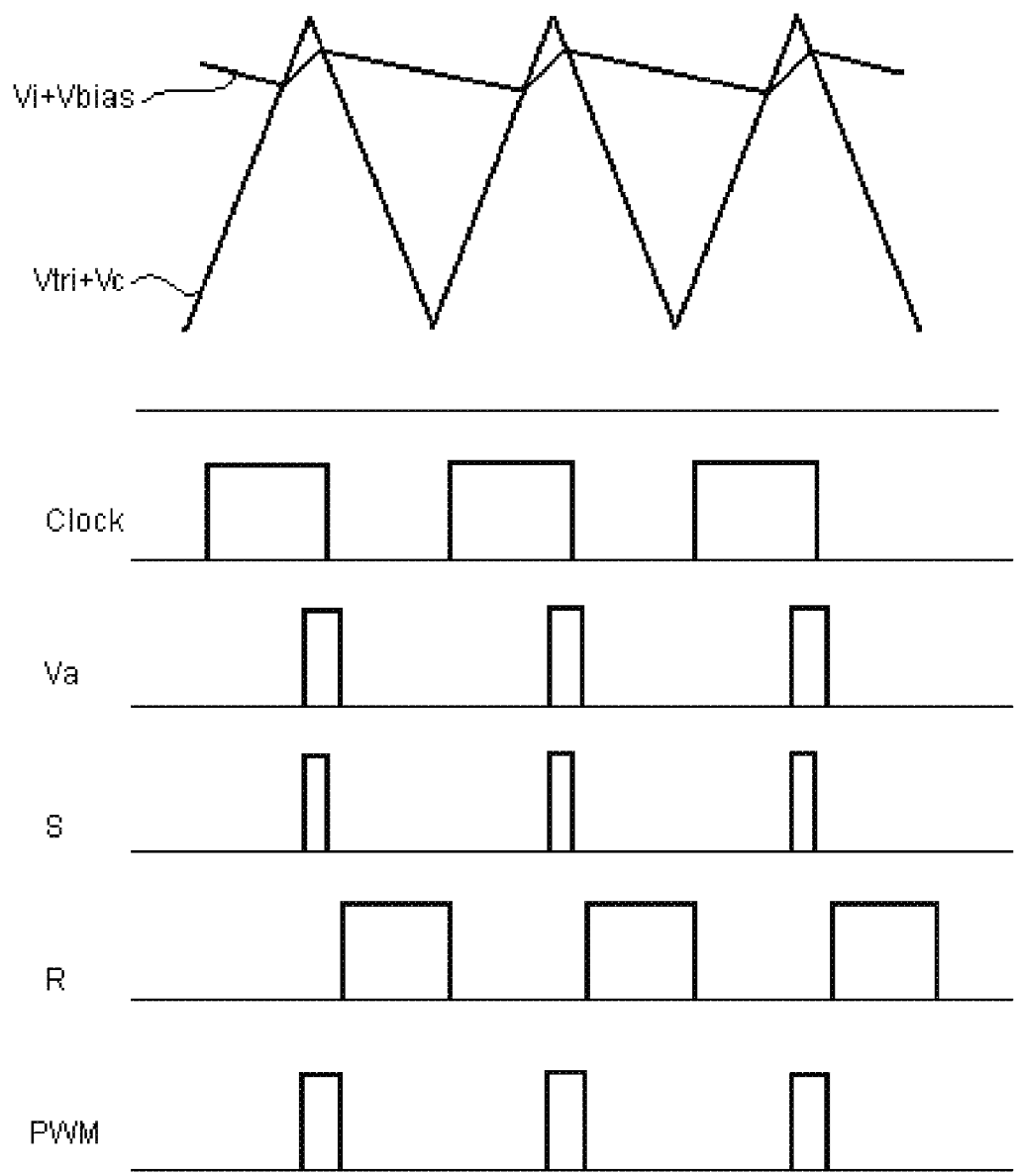
FIG. 8C shows a functioning waveform of the noise suppression circuit.

The function of the noise suppression circuit 80 is shown in FIG. 8C. The waveforms in the diagram are respectively: Vi+Vbias, Vtri+Vc, the clock signal Clock, the output of the PWM comparator 33 Va, the output of the AND gate 82 S, the output of the NOR gate 83 R and the modulated PWM signal. In this control, the leading edge of the PWM signal can only appear at the high level of the clock signal, and the trailing edge of the PWM signal can only appear at the low level of the clock signal where the high level of the clock signal is in phase with the rising edge of the triangular waveform and the low level of the clock signal is in phase with the descending edge of the triangular waveform. Under no noise situations, the modulated PWM signal is the same with Va, the PWM signal in FIG. 3. When noise occurs, the noise suppression circuit 80 effectively eliminates the error trigger. However, the adoption of the noise suppression circuit 80 lowers down the transient response compared to the double-edge PWM control embodiments as described above from FIG. 2 to FIG. 6 since it can only turns on the switch on the rising edge of the triangular signal and turns off the switch on the descending edge of it. For example, the maximum delay time is about 0.5T with the noise suppression circuit 80 when adopted in the embodiment shown in FIG. 2. However, it still has faster transient response than the peak current mode control.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

We claim:

1. A double-edge PWM controller, comprising:
   an error amplifier, generating a compensation signal;
   a first adder, summing up said compensation signal and a triangular signal or a saw-tooth signal;
   a second adder, summing up an output current feedback signal and a bias value;
   a PWM comparator, with its non-inverting input connected to the output of said first adder, its inverting input connected to the output of said second adder and outputs PWM signal.

2. The controller in claim 1 wherein said bias value is selected such that the output of said second adder is between the maximum value and the minimum value of said triangular signal or said saw-tooth signal.

3. The controller in claim 2 wherein said triangular signal is symmetrical.

4. The controller in claim 2 wherein said triangular signal is symmetrical.

5. The controller in claim 2 further comprising an noise suppression circuit which comprises an AND gate, a NOR gate and an RS flip-flop, wherein said AND gate and said NOR gate each receives said PWM signal and a clock signal, the output of said AND gate is connected to the SET input of said RS flip-flop and the output of said NOR gate is connected to the RESET input of said RS flip-flop.

6. The controller in claim 5 wherein the high level of said clock signal is in phase with the rising edge of said triangular signal and the low level of said clock signal is in phase with the descending edge of said triangular signal.

7. The controller in claim 2 wherein said output current feedback signal is the sensed signal of an output inductor current.

8. The controller in claim 1 is used in a buck converter.

9. A double-edge PWM control method, comprising:
   comparing a compensated signal to an output current signal wherein said compensated signal is a sum of a compensation signal and a triangular signal or a saw-tooth signal;
   outputting HIGH PWM signal when said compensated signal is higher than said output current signal, and;
   outputting LOW PWM signal when said compensated signal is lower than said output current signal.

10. The control method in claim 9 wherein said compensated signal is compared to the sum of said output current signal and a predetermined DC signal.

* * * * *